United States Patent

Kooi

[15] 3,649,886

[45] Mar. 14, 1972

[54] SEMICONDUCTOR DEVICE HAVING A SEMICONDUCTOR BODY OF WHICH A SURFACE IS AT LEAST LOCALLY COVERED WITH AN OXIDE FILM AND METHOD OF MANUFACTURING A PLANAR SEMICONDUCTOR DEVICE

[72] Inventor: Else Kooi, Emmasingel, Eindhoven, Netherlands

[73] Assignee: U.S. Philips Corporation, New York, N.Y.

[22] Filed: Nov. 19, 1968

[21] Appl. No.: 776,922

[30] Foreign Application Priority Data

Nov. 21, 1967 Netherlands ..........6715753

[52] U.S. Cl. ..........317/235 R, 317/235 B, 317/235 G, 317/235 AG, 29/571, 117/212, 117/215

[51] Int. Cl. ..........H01l 07/00, H01l 11/14, H01l 5/06

[58] Field of Search ..........317/235

[56] References Cited

UNITED STATES PATENTS

| | | | |
|---|---|---|---|
| 3,550,256 | 12/1970 | Deal | 317/235 |
| 3,455,020 | 7/1969 | Dawson et al. | 317/235 |
| 3,463,974 | 8/1969 | Kelley et al. | 317/235 |
| 3,475,234 | 10/1969 | Kerwin et al. | 317/235 |
| 3,477,886 | 11/1969 | Ehlenberger | 317/235 |
| 3,484,313 | 12/1969 | Tauchi et al. | 317/235 |

FOREIGN PATENTS OR APPLICATIONS

| | | | |
|---|---|---|---|
| 667,423 | 7/1963 | Canada | 317/235 |

OTHER PUBLICATIONS

IBM Tech. Discl. Bul. "Formation of Depletion and Enhancement Mode Field Effect Transistors" by Lehman et al., Vol. 8, No. 4, Sept. 65 pg. 675–76

IBM Tech Discl Bul. "Low Surface Charge Density Silicon with a Silicon nitride coating" by Doo et al, Vol 10, no. 7, Sept. 67 Page 488.

*Primary Examiner*—Jerry D. Craig
*Attorney*—Frank R. Trifari

[57] ABSTRACT

Semiconductor devices are described having on a semiconductor surface an insulating layer having a first portion of silicon oxide without silicon nitride and a second portion of silicon oxide covered with silicon nitride. These layers are provided so as to establish at the semiconductor surface certain desired concentrations or densities of semiconductive surface states and surface or oxide charges in order to control the performance of the device.

11 Claims, 20 Drawing Figures

ELSE KOOI INVENTOR.
BY
Frank R. Trifari
AGENT

INVENTOR.
ELSE KOOI
BY
Frank R. Trifari
AGENT

INVENTOR.

ELSE KOOI

BY

AGENT

INVENTOR.

ELSE KOOI

BY

AGENT

SEMICONDUCTOR DEVICE HAVING A SEMICONDUCTOR BODY OF WHICH A SURFACE IS AT LEAST LOCALLY COVERED WITH AN OXIDE FILM AND METHOD OF MANUFACTURING A PLANAR SEMICONDUCTOR DEVICE

The invention relates to a semiconductor device, for example, a transistor, a diode, a field-effect transistor or an integrated circuit, having at least one semiconductor body of which a surface is at least locally covered with an oxide film and further relates to a method of manufacturing such a semiconductor device. If required, the oxide film may have previously been used at least partly for masking surface parts upon diffusion of active impurities but many alternatively have been provided at least partly after the formation of the material construction of the semiconductor body, essential for the semiconductor device, for example, the formation of regions of different conductivity types and/or conductivities.

Such semiconductor devices are known in various constructions. In particular, silicon was used as a semiconductor material while the oxide film may consist wholly or partly of silicon dioxide and/or a generally vitreous silicate. However, it is also known to use such oxide films in semiconductor devices having a semiconductor material other than silicon, for example, germanium, a compound of the type $A^{III}B^{V}$, in particular gallium arsenide (GaAs), or a compound of the type $A^{II}B^{VI}$, in particular cadmium sulphide or cadmium selenide, and the invention also relates to such semiconductor devices.

The semiconductor device may comprise a single circuit element, for example, a transistor, a field-effect transistor or a diode, but may alternatively comprise a number of circuit elements which are preferably connected together electrically in such manner that a circuit unit, often termed integrated circuit, is obtained. At least a part of the circuit elements comprises parts of the semiconductor material, but, as is known, it is alternatively possible to construct certain circuit elements, for example, resistors and capacitances, in a different manner.

In such semiconductor devices, the oxide film may serve as a protection of the semiconductor surface, as an insulation between the semiconductor material and the conductive connections in the form of metal strips, and as a dielectric between the semiconductor surface and capacitively coupled electrodes in the form of metal layers provided on the insulating film, for example, in field-effect transistors having an insulated gate electrode or in a capacitor of which one of the electrodes consists of a semiconductor material.

However, the oxide film may alternatively or also be of importance to obtain favorable surface properties of the semiconductor material, in particular to obtain a greater stability of the semiconductor properties.

In the published description and claims of the Dutch Pat. No. 6,507,231 (PHN. 895), laid open to public inspection, it was already stated that the properties of a semiconductor device of the type mentioned in the preamble are also dependent upon the properties of the oxide film coating. For example, in an integrated circuit which comprises two circuit elements with parts which, as regards doping of the semiconductor material, have a mutually equal construction, said parts may be given a mutual difference in electric properties by producing a mutual difference in properties of the oxide film coating. It is even possible to give two chemically identical parts of the oxide film a difference in properties, for example, by subjecting both parts to a thermal treatment, one part being previously given a coating with a different material, which coating is lacking in the other part.

As a possibility of occurrence of a local difference in properties of the oxide film coating was mentioned the presence of charge, in particular of positive charge, presumably lying in the oxide, in one part and the substantial absence or presence to a lesser degree of such a charge in the oxide in the other part. Any charge in the oxide film influences the state in the underlying semiconductor material. Actually, if said oxide charge is positive, it attracts negative charge carriers and repels positive charge carriers. If the underlying semiconductor material is of the N-type, a zone with increased concentration of mobile electrons is formed at the boundary with the oxide. If the underlying material is P-conductive, a space charge region with reduced concentration of holes is formed. The effect may even be so strong that a zone with substantially negative charge carriers (free electrons) is formed at the surface. Such a zone with an induced excess of charge carriers of the opposite type may be termed "inversion layer." It is to be noted that, although it is assumed that in the oxide itself centers with positive charge are present, such centers may be present wholly or partly near or immediately on the surface of the semiconductor material in the form of positive donor ions, for example, by a gettering action of the oxide film coating during its formation or during an aftertreatment, which can influence in a corresponding manner the electric properties in the semiconductor surface as a positive charge in the oxide itself. In addition it is possible in principle that negative charge may be present with the oxide film coating, for example, in the oxide film itself, for example at the boundary layer in the form of acceptor ions or at the boundary layer in the semiconductor. Hence, where in this description there is referred to "oxide charges," this term should be considered to have a very wide meaning and to include the above described cases. Consequently, the terms "many oxide charges" and "few oxide charges" should be coupled to the occurrence or nonoccurrence of phenomena as will be described hereinafter with reference to FIGS. 2 to 5.

The invention is based inter alia on the idea of using oxide film coatings, with locally different properties.

The recognition regarding the properties of a semiconductor body coated with an oxide film has meanwhile been further extended. For example, it is assumed that at the boundary of the semiconductor material and the oxide film, trapping centers for charge carriers may be present in a density which is large relative to similar centers in parts of the semiconductor material farther remote from the surface. Such trapping centers at the boundary with the oxide film are hereinafter referred to as "surface states" in analogy with the English term. Although the density of said surface states is larger than the density of the trapping centers in the interior of the semiconductor material, said density may be so small that they hardly influence the properties of the semiconductor device. However, the density of said surface states often is so large that the presence of said surface states is significantly noticeable in the characteristics of the semiconductor device in question.

Up till now the presence of trapping centers which, as is known, may also be operative as recombination centers and generation centers at the semiconductor surface, for example, the above mentioned surface states, was generally considered to be unfavorable for the properties of semiconductor devices.

The present invention is inter alia partly based on the idea that for reaching given useful effects, the local presence of many surface states may be useful. Together with what was said above regarding the oxide charges, the invention is inter alia based on the recognition of the fact that for judging the suitability of the properties of an oxide film on a semiconductor device, different standards can be imposed for semiconductor parts with different functions as regards the density of the oxide charges and/or the density of the surface states.

These densities of the oxide charges and the surface states are determined not only by the manner of providing the oxide layer but also by aftertreatments, if any, for example, a tempering treatment. It is known that the possible presence of a coating of a different nature on the oxide layer and the composition of the ambient atmosphere may be of influence.

It has in addition been described that in diffusion treatments the semiconductor surface may be masked with silicon nitride instead of with silicon oxide. Silicon nitride has the advantage that the masking effect is better than that of silicon oxide and that it also has a masking effect, for example, for gallium diffusion.

It has furthermore been found that silicon nitride can form a protective layer for protecting underlying material against atmospheric influences better than silicon oxide. For the use as a coating of a surface consisting of silicon in semiconductor devices, however, it has the drawback that the surface properties of the silicon can be less readily controlled than when using a silicon oxide coating.

It is also an object of the invention to influence the properties of an oxide film coating on a semiconductor by using a silicon nitride film on the oxide film coating. On the one hand the favorable properties of oxide film coatings on the semiconductor surface are used and on the other hand the protective effect of the silicon nitride film against atmospheric influences on the oxide film in various treatments, in particular thermal treatments, is used. It has been found, that probably as a result of the said protecting effect of the silicon nitride and the inert properties of said substance, for example, when using heat, the resulting properties of the underlying oxide in general are independent of the composition of the atmosphere in which such treatment has taken place.

The invention is furthermore based on the recognition of the fact that the properties of the oxide film coating below the nitride obtained in the above-described manner, need not in all cases be the most favorable properties and that for various uses other properties may be desirable. For example, for a given semiconductor circuit element, or a given semiconductor device consisting of combined semiconductor elements, for example, in an integrated circuit, a difference in properties of the oxide film coatings may be desirable for various parts of the surface of the semiconductor provided with an oxide film coating, in particular as regards the density of the surface states and/or the density of the oxide charges. According to the invention a semiconductor device, for example, a transistor, a diode, a field-effect transistor or an integrated circuit having a semiconductor body a surface of which is locally coated with an oxide film, is characterized in that said oxide film is coated with a silicon nitride layer for at least one part of its surface and is not coated with such a layer for at least one other part of its surface. With such a partial coating of the oxide film with silicon nitride various effects can be obtained; even in the case that the two parts of the oxide film have a substantially equal material construction, said parts can influence the semiconductor properties of the underlying material in different manners, but, if desired, similar effects of the two parts can be obtained. The latter may be of importance when locally a conductive path in the form of a layer is laid on part of the oxide film, for example, to a contact arranged in a window in the oxide film. When such a conducting layer lies on the oxide and is subjected to a thermal treatment in the further manufacture of the semiconductor device, said layer may influence the properties of the underlying part of the oxide film so that said part obtains properties which differ from those of a part which has substantially the same composition but which does not support a conductive layer. The interposition of a silicon nitride layer can prevent the occurrence of such a difference in properties.

The oxide film is preferably chosen on the basis of silicon oxide glasses, and that not only due to their recognized favorable properties for semiconductor devices but also because they can be readily combined with silicon nitride. This applies in particular to the case in which the oxide film consists of silicon oxide, at least as far as the material adjoining the semiconductor is concerned.

As stated above, the local silicon nitride layer on the oxide film may be useful to counteract a difference in properties of two parts of an oxide film coating. It is of greater importance, however, that a desired difference in properties can be obtained. Therefore the density of the surface states at the interface between the oxide and the semiconductor and/or of the charge centers in the oxide, termed oxide charges, in case of a part which is coated with the silicon nitride layer preferably differs from the corresponding density in case of a part which is not coated with the silicon nitride layer. As will be explained hereinafter, various differences in properties of the oxide layer can be obtained, as is desired, while using a partial coating of silicon nitride on the oxide film.

It is further remarked, that oxide film coating parts may be used, having a heterogeneous structure consisting of two or more superposed oxide layers. Said oxide film-coating parts composed of more than one oxide layer may be covered locally or entirely with a silicon nitride layer. Alternatively an oxide film-coating part, not covered with the silicon nitride layer may be composed of two or more superposed oxide layers and an oxide film-coating part which is covered with silicon nitride, may have a homogeneous structure of a single oxide layer. In the latter case the oxide film-coating part covered with silicon nitride may substantially consist of the same material and may, in addition, have substantially the same thickness as the undermost layer of the oxide film-coating part composed of more than one layer. The superposed oxide layer structure may have been formed during a diffusion step, i.e., when diffusing phosphorus or boron using a diffusion mask consisting of silicon oxide, in which at the exposed surface of the silicon oxide mask a layer consisting of phosphate glass or borate glass, RESP. is formed. Alternatively the structure consisting of superposed oxide layers may have been formed by deposition of an oxide, F.I. by means of a known method such as chemically from a suitably composed gas or by sputtering, onto an oxide layer already present. Said deposition may have been carried out before or after the local application of the silicon nitride layer. A suitable material for such an oxide layer present on another oxide layer in a heterogeneous oxide film coating is aluminum oxide.

In the case of semiconductor devices which comprise a PN-junction which emerges at a semiconductor surface which is coated with an oxide film, which junction in normal use is at least temporarily operated in the reverse direction, instabilities may occur in that, due to capacitive effects, displacements of charge, in particular slow displacements of charge, at the surface of the oxide film or in the immediate proximity thereof may occur. It has been found that such displacements of charge do not occur or occur at least to a strongly reduced extent when the oxide is coated with the silicon nitride layer at the area of the PN-junction. In order to be able to choose in addition the properties of the oxide layer at will, parts of the oxide film, at least on one side, should preferably be free from the silicon nitride layer.

It is alternatively possible to compensate for the disadvantageous effect of the above-mentioned displacements of charge by using many surface states at the area where the PN-junction emerges at the surface. Variations of the charge distribution at the semiconductor surface by displacements of charge on or in the oxide film may for the greater part be compensated by the degree of occupation of the surface states with electrons, the nature and the concentration of mobile charge carriers at the semiconductor surface varying only to such a small extent that the said instabilities are suppressed. This high concentration of surface states, however, may be unfavorable at other surface parts of the semiconductor device. Preferably the part of the oxide film which lies across the said PN-junction involves many surface states and at least one adjacent part of the oxide film involves few surface states, said two parts differing as regards whether the silicon nitride layer is applied or not.

Further preferred embodiments of the semiconductor device according to the invention will be described hereinafter.

The invention also relates to a method of manufacturing a semiconductor device in which, by the local diffusion of one or more donors and/or acceptors, regions of different conductivity types are formed at a surface of the semiconductor body, the surface being at least partly coated with an oxide film. According to the invention this method is characterized in that the oxide film is coated for at least one part of its surface with a silicon nitride layer and is not coated with such a layer over at least one other part of its surface. This is to be understood to include the case in which the silicon nitride is first provided all over the surface and is then removed from at least one part of the surface, while the silicon nitride layer is retained on one or more other parts of the surface. After the diffusion treatment or diffusion treatments and providing the oxide film which is at least partly coated with the silicon nitride layer, preferably at least one thermal aftertreatment is carried out. It is found that in such a thermal aftertreatment the resulting properties of the parts of the oxide film which are not coated with the silicon nitride layer are generally dependent upon the atmosphere used, while the resulting properties of the oxide film parts which are coated with the nitride layer are generally found not to be dependent upon the said atmosphere.

Of course more than one thermal aftertreatment may be carried out. In addition the properties of the oxide film parts coated with the silicon nitride layer may depend upon treatments preceding the provision of the silicon nitride layer and/or upon the method of providing the silicon nitride layer as will be described hereinafter.

Once the properties of the oxide film parts are fixed as is desired, the nitride layer may be removed, if required, provided no treatments at high temperature, for example, above 400° C. are used. Alternatively it is possible, after fixing the desired properties of the parts of the oxide film, to coat the oxide film entirely with silicon nitride at a low temperature.

It is alternatively possible to obtain more than two, for example three, types of oxide film parts with mutually different properties while using different temperature treatments and intermediate variation of the form of the silicon nitride layer. For example, the temperature treatments may be carried out with a different composition of the atmosphere used, as will be explained in detail hereinafter with reference to an example.

In principle it is possible to provide the oxide film and the nitride layer thereon already prior to the diffusion treatment(s) to be applied or at least prior to the last diffusion treatment, in which, in addition, during such a diffusion treatment, a new part of the oxide film may be formed in a window provided in the oxide film already existing.

When such an oxide partly coated with the nitride layer is already present in the last diffusion treatment, a thermal aftertreatment is preferably carried out. In this aftertreatment a suitable atmosphere may be chosen in order to give the parts of the oxide film which are not coated with the silicon nitride layer the properties which are most favorable for the semiconductor device.

It is to be noted that where hereinafter there is referred to the provision of channel-stopping regions, said regions are preferably provided on the surface parts which were masked during the diffusion process, since the doping concentration at said surface parts of the semiconductor body may remain so low that the possibility of inversion exists.

In order that the invention may be readily carried into effect, it will now be described in greater detail, by way of example, with reference to the accompanying drawings, in which:

FIGS. 15 and 16 are cross-sectional views of two successive stages of the manufacture of planar transistors.

FIG. 17–10 are cross-sectional views of a detail of a semiconductor device which comprises two MOS-transistors in successive stages of manufacture.

The influence of oxide charges and surface states on the electric properties of a semiconductor coated with an oxide film are described in a Thesis by E. Kooi which is edited by "-Philips Technical Library," 1967, under the title "The Surface Properties of Oxidized Silicon" to which reference is made for further details. This influence on the electric properties of a field-effect transistor of the MOS-type will now be described briefly with reference to FIGS. 1 to 5.

Figure 1:
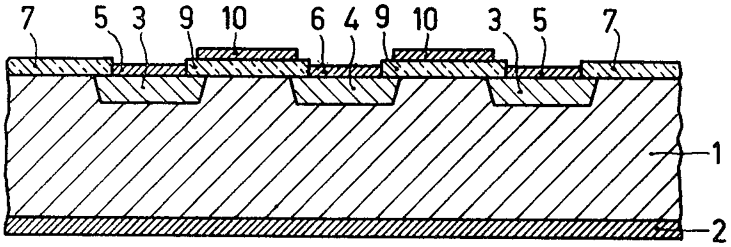
FIG. 1 is a cross-sectional view through a MOS-transistor with which, in addition, capacitance measurements may be carried out.

FIG. 1 is a cross-sectional view through a semiconductor device which may be used as a MOS-transistor or may serve for capacitance measurements. This semiconductor device consists of a semiconductor body 1, for example, of P-type silicon, which comprises an ohmic contact 2 on one side. Two regions, an annular region 3 and a circular region 4, located on the side opposite to the contact 2 have a conductivity type opposite to that of the remainder of the semiconductor material. They may be used as a source and drain, resp. electrode when using the device as a MOS-transistor. For that purpose they are provided with ohmic contact layers 5 and 6, respectively. An oxide film coating 7 is arranged on said side and is interrupted at the area of the contacts 5 and 6. The annular part 9 on the surface part between the regions 3 and 4 constitutes the dielectric of the MOS-transistor and is provided with an annular gate electrode 10. The same device may be used for capacitance measurements between the electrode 10 and the contact 2, the contacts 5 and 6 of the source and drain electrode of the MOS-transistor then being short-circuited with the contact 2.

The curves in FIGS. 2 to 5 relate to semiconductor devices as shown in FIG. 1, in which the semiconductor body consists of P-type silicon and the regions 3 and 4 of N-type silicon.

Figures 2, 3:
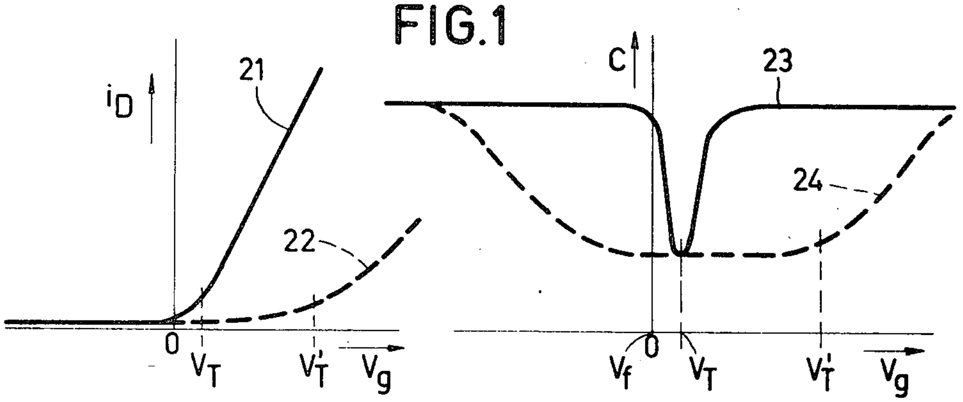
FIGS. 2 and 4 are graphs in which for various MOS-transistors of the type shown in FIG. 1 the saturation current $i_D$ is plotted against the gate voltage $V_g$.
FIGS. 3 and 5 are graphs in which of the above mentioned various MOS-transistors of the type shown in FIG. 1 the corresponding capacity C is plotted against the gate voltage $V_g$.

The curves shown in FIG. 2 diagrammatically give two cases of the variation of the saturation current intensity between the source and drain electrode with varied gate voltage. The curve 21 relates to an oxide film coating having substantially no oxide charges and a few surface states, while the broken line curve 22 relates to an oxide film coating with few oxide charges and many surface states. The associated curves for the dependence of the capacitance measured between the contact 2 and the gate electrode 10 on the applied gate voltage measured at a frequency of 500 kc./s. is denoted by the solid-line curve 23 for few oxide charges and few surface states and by the broken-line curve 24 for few oxide charges and many surface states. It is to be noted that the variation of the curve 24 also depends upon the frequency used in measuring the energy levels of the surface states in the forbidden band of the semiconductor. The width of the zone with reduced capacity is an indication, at a suitable measuring frequency, of the presence or absence of many surface states. For this purpose see the above Thesis by E. Kooi, section 7.4.1, pp. 122–124 and chapter 2.7 pp. 27–33 in which surface states are termed "interface states."

Figures 4, 5:
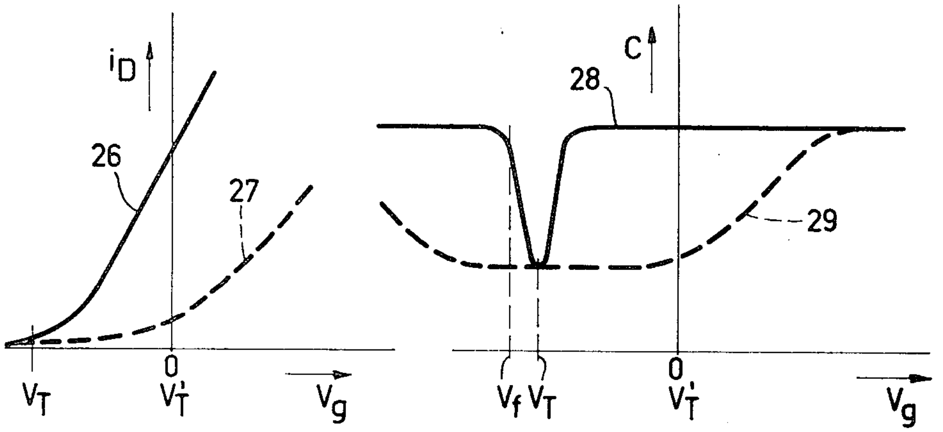

FIGS. 4 and 5 diagrammatically show the dependence of the saturation current $i_D$ and the capacitance measured at 500 mc./s., respectively, on the gate voltage in the case of many oxide charges, the solid-line curves 26 and 28 relating to a few surface states and the broken-line curves 27 and 29 relating to the presence of many surface states. All the cases relate to MOS-transistors of the NPN-type, in which the body 1 is of P-type material and the source and drain electrodes 3 and 4 are of N-type material. FIGS. 4 and 5 further relate to oxide film coatings with positive surface charges.

The curves shown in FIGS. 2 to 5 may may be interpreted as follows. The curves 21 and 23 in FIG. 2 and FIG. 3, respectively, relate to the case that substantially no oxide charges and substantially no surface states are present. When a negative bias with respect to the underlying P-type semiconductor material is given to the electrode 10, for example, by a bias relative to the source electrode, positive charge will be induced at the semiconductor surface, that is to say that the concentration of holes increases there. Apart from a small leakage current, no conduction is possible between the N-conductive parts 3 and 4. The capacity is determined by the oxide layer since conductive parts with a high concentration of mobile charge carriers are present on both sides of the oxide layer. When the bias voltage is varied in the direction of the zero value, the charge induced at the surface of the semiconductor will decrease so that also the concentration of holes decreases. As a result of this impoverishment, the capacity gradually decreases. With a gate voltage $V_f$ the concentration of holes at the surface of the semiconductor below the gate electrode is equal to that in the P-type material of the interior of the semiconductor body. The energy bands which showed a bend near the surface of the semiconductor have become entirely smooth. Therefore, this gate voltage $V_f$ is termed "flat band voltage." Apart from the incorporated contact potential of the metal electrode which generally is only small, said flat band voltage lies at the value zero in the absence of oxide charge. When the gate voltage increases towards positive values, in which the concentration of holes at the semiconductor surface is further reduced by repellence, a space charge region will be formed with a low concentration of mobile charge carriers so that said region operates, as it were, as a dielectric. As a result of this the capacitance value will decrease. The minority charge carriers, in this case electrons, the concentration of which was negligibly small, will gradually begin to increase slightly. The effect of this increase is substantially not yet noticeable since the concentration of electrons remains negligibly small until the concentration of holes becomes equal to the concentration of electrons. This is the case at the so-called threshold voltage $V_T$ at which the capacity reaches its lowest value. The concentration of electrons has then become such that a very small conduction is possible at the semiconductor surface between the source and drain electrodes (see FIG. 2, curve 21). When the gate voltage is increased from $V_T$ inversion occurs at the semiconductor surface, that is to say the concentration of the electrons becomes larger than that of the holes. A conductive channel is formed between the source and drain electrodes which channel becomes wider when the gate voltage further increases while the concentration of electrons therein increases. When the gate voltage is increases, a strong rise of the saturation current is found between the source and drain electrode (see curve 21). From the capacity curve 23 (see FIG. 3) it is apparent that when the gate voltage is increased above $V_T$ the capacity again rapidly increases to approximately the value it had with a strong negative bias voltage. This increase results from the fact that with the inversion, the number of charge carriers at the surface starts increasing rapidly. Since during capacitance measurement the source and drain electrodes 3 and 4, respectively, are short-circuited with the contact layer 2, the dielectric is restricted to the oxide layer between the gate electrode and the semiconductor surface. The regions 3 and 4 serve, as it were, as electron reservoirs for supplying the inversion channel.

In the presence of many surface states, approximately the same behavior will occur with a strong negative gate voltage as is described above for the absence of said surface states. When the gate voltage is increased, again a space charge region will be built up which reduces the capacity. Once the capacity has reached a minimum value, negative charge carriers will be attracted to the surface when the gate voltage is further increased but said charge carriers are trapped by the surface states so that no readily conducting inversion channel is formed. Only when, with a further increase of the gate voltage, the surface states become more or less saturated with electrons a conductive inversion channel of mobile electrons may be formed. The capacity will increase again and, as shown in FIG. 2 by the broken-line curve 22, current will flow again between the source and drain electrode. Although a majority of the surface states contain trapped electrons, the degree of occupation therewith may increase further so that the saturation current will increase less strongly with the gate voltage than in the absence of surface states (compare curve 22 with curve 21). When hereinafter there is referred to an oxide film coating with many or few surface states, this is to be understood to include oxide film coating which, upon capacity measurements at a suitable frequency as described above, show a wide and a narrow region, respectively, with reduced capacity plotted in the curve against the gate voltage. The width of said region constitutes a measure of the number of surface states.

FIGS. 4 and 5 relate to an oxide film coating with many oxide charges, namely with positive oxide charges. The solid-line curves in these FIGS. relates to such an oxide coating with few surface states. The solid-line curve 26 in FIG. 4, in which, like in FIG. 2, the saturation current is plotted against the gate voltage, and the solid-line curve 28 which, like in FIG. 3, denotes the variation of the capacity with the gate voltage, corresponds, as regards their shape, to the curves 21 and 23, respectively, in FIGS. 2 and 3, respectively. However, relative to these latter they are shifted towards lower values of the gate voltage. At a zero gate voltage, the influence of the oxide charges on the semiconductor material adjoining the oxide film is so large that inversion occurs at the semiconductor surface. By applying a negative bias voltage the action of the oxide charge can be neutralized. The threshold voltage $V_T$ at which such a compensation of the oxide charges occurs that inversion at the semiconductor surface is just counteracted, lies at a strongly negative value. At the same value of the gate voltage the capacity has a minimum value. Since the oxide film coating in the case described contains few or no surface states, the saturation current rapidly increases upon variation of the gate voltage from a value $V_T$ in the direction of a gate voltage of zero. At the value $V_T$ the capacity curve 28 shows a sharp minimum, while the difference between said threshold voltage and the flat band voltage $V_f$ is small.

When the oxide film coating involves both many oxide charges and many surface states, the values of the saturation current and of the capacity may show a variation in the manner as is denoted in FIGS. 4 and 5, respectively, by the broken-line curves 27 and 29, respectively. The shape of these curves again corresponds to the broken-line curves 22 and 24, respectively, in FIGS. 2 and FIG. 3, respectively. Inversion is counteracted by trapping the charge carriers, so that the low-capacitance values extend over a comparatively wide gate voltage range in accordance with the number of said surface states, as is shown by the broken-line curve 29 in FIG. 5. The saturation current also remains low until due to filling-up of the trapping centers a conductive channel is formed between the source and drain electrode. In the case shown in FIG. 4 the effect of the oxide charges is approximately compensated for by the action of the surface states, a reasonably rapid rise of the saturation current intensity with the gate voltage from a very low value appearing only from a gate voltage of approximately zero. As a result of this the broken-line curve 27 of FIG. 4 is more or less similar to the curve 21 of FIG. 2, but has a less steep slope. However, a strong difference in measuring the capacitance remains as is obvious from a comparison of curve 29 in FIG. 5 with curve 23 in FIG. 3.

It is to be noted that with the choice of the frequency to be used in the capacity measurement in the present case the possibility of charge displacement from the regions 3 and 9 play a role so that in the formation of an inversion channel a rise of the capacity can be measured to approximately the value which is determined substantially only by the dielectric between the semiconductor surface and the gate electrode. On the other hand, at very low frequencies the population degree of the surface states with electrons will vary during the measurement so that their presence can be established in the measurements with greater difficulty. In the present case of P-type silicon, measuring frequencies of, for example 400–600 kc./s. have been found suitable.

The influence of oxide film coatings on a PN-junction emerging at a surface of a semiconductor body will be explained in detail with reference to FIGS. 6 to 8. This influence is considered in particular in a PN-junction biased in the reverse direction.

Figure 6:
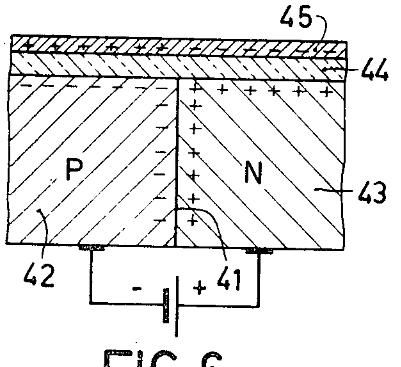
FIGS. 6, 7 and 8 are cross-sectional views of parts of semiconductor devices in which a PN-junction emerges at a part of the semiconductor surface coated with an oxide film.

FIG. 6 is a diagrammatic cross-sectional view of a part of a semiconductor body in which a PN-junction emerges at the surface of the body. The PN-junction 41 is located between a P-region 42 and an N-region 43. T An oxide film coating 44 is provided on the surface of the semiconductor body. As is described, for example, in the above mentioned thesis, section 2.11.2, pp. 46–48, charge may be displaced on the free surface of such an oxide film under the influence of an electric field. When the PN-junction 41 is biased in the reverse direction, the N-region 43 is biased positively relative to the P-region 42. As a result of this bias voltage negative charge may accumulate at the surface of the oxide film above the N-region 43 and positive charge may accumulate above the P-region 42 in the long run as a result of charge displacement. These charge displacements may give rise to instabilities. It is proposed now to coat the oxide film at the area of the PN-junction with a metal layer 45. When the bias voltage across the PN-junction 41 is varied, a rapid adaptation to the varied situation will take place as a result of rapid charge displacement in the metal layer 45. The metal layer is preferably short-circuited with one of the two regions 42 or 43. However, it is possible that at a comparatively high bias voltage of the PN-junction, inversion occurs at the surface of one of the two regions 42 and 43, as a result of capacitive coupling through the metal layer. This inversion involves an increase of the surface area of the PN-junction and hence an increase of the capacity across the PN-junction. An undesired leakage path may also be formed to a part which may be located further on, for example, a region of opposite conductivity type located elsewhere.

It is possible that a metal coating is locally used across the PN-junction which is not connected to one of the two regions on either side of the PN-junction, but is at a different potential, for example, because it forms part of a metal connection to a third region of a given conductivity type. If desired, the said voltage may be variable with respect to the regions 42 and/or 43. In the case described here, many surface states will stabilize the conductivity properties at the surface of the parts 42 and 43 in a condition of little conduction in which inversion is counteracted.

Figure 7:
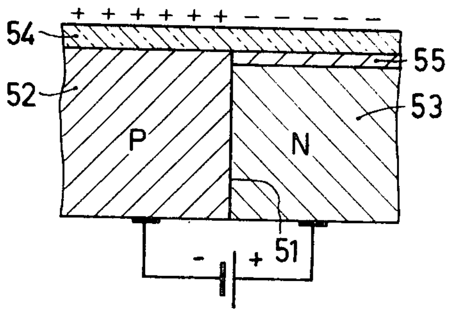
Figure 8:
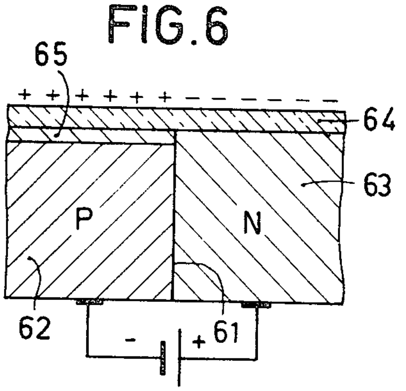

In FIGS. 7 and 8 cases will be described in which surface conductivity is possible at the surface of an oxide film coating located across a PN-junction, either as a result of the nature of this surface itself, and components, for example, ions, possibly absorbed thereon, or by a metal layer provided thereon and having a floating potential. In the case of FIG. 7 the PN-junction 51 lies between a high-doped $P^+$-region 52 and a low-doped N-type region 53. When this PN-junction is biased in the reverse direction, negative charge will be accumulated above the region 52, and positive charge will be accumulated above the region 53 by conduction at the upper side of the oxide film coating. As a result of this the concentrations of the majority charge carriers at the semiconductor surface below the oxide film coating will also be reduced again. In the high-doped $P^+$-region 52, however, inversion will not easily be possible. However, this may be the case indeed with the region 53 in which a P-conductive inversion channel 55 may be formed.

In the case shown in FIG. 8 inversion may similarly occur with a PN-junction 61 biased in the reverse direction between a low-doped P-type region 62 and a high-doped N-type region 63 by conduction at the upper side of the oxide film coating 64 on the side of the low-doped P-conductive region in which an N-conductive channel 65 may be formed.

In the cases described in FIGS. 7 and 8 the formation of an inversion channel in the low-doped region may be counteracted by using an oxide film coating which involves many surface states. In $P^+N$-diodes (FIG. 7) an oxide film coating may also be used with many positive oxide charges which also counteracts the inversion at the surface of the N-conductive region. However, if the absence of surface states there are a great many oxide charges, a decrease of the breakdown voltage could occur as a result of the formation of a $P^+N^+$-contact at the surface. Particularly when high-back voltages are used, an oxide film coating with many positive oxide charges and many surface states will improve the stability. In the case described with reference to FIG. 8 of a $PN^+$-diode the presence of positive oxide charges will intensify inversion at the surface of the weakly doped P-conductive region 62. Therefore, in this case an oxide film coating will preferably be chosen which involves few positive oxide charges and may surface states. In analogy herewith, in the case oxide film coatings are possible which involve a negative oxide charge, such negative oxide charges will promote inversion in the case of FIG. 7 and counteract inversion in the case of FIG. 8.

Where, in the above described cases of an oxide film on a part of a semiconductor surface where a PN-junction emerges, given properties of said oxide film are desirable, other requirements will generally be imposed upon other parts of the surface so that other properties of the oxide film part at that area are desirable. Such a difference can be obtained by means of an oxide film which on one part is not coated with a silicon nitride layer and on another part is coated indeed with a silicon nitride layer.

Furthermore it is also possible to obtain parts of the oxide film with substantially the same or similar properties, a silicon nitride layer being located on one part and being not located on another. In the case of a PN-junction which is biased at least temporarily in the reverse direction, charge displacement along the free surface of the oxide above said PN-junctions can be prevented by coating with a silicon nitride layer on which such a charge displacement will not occur as such, at least not to such an extent that a significant influence on the underlying semiconductor material is experienced therefrom. In this case it is only necessary to apply said silicon nitride on a strip across the PN-junction.

It may furthermore be desirable to interrupt the silicon nitride layer locally. Actually, it is possible that, for example, during or after a thermal treatment in which the silicon nitride layer covers a large surface area, for example, with a width of more than 300 microns, thermal stresses may occur which may produce cracks in the underlying oxide film. Therefore, an interruption, particularly at a place where the properties of the oxide film have little influence on the characteristics of the semiconductor device, may be of advantage.

By locally applying a silicon nitride coating on the same oxide film coating and locally omitting said nitride layer, it is possible to obtain two juxtaposed parts, which as regards oxide charges and surface states, are either of the same nature or of a different nature. The theoretically possible cases of occurrence of positive oxide charges $\phi_{ox}$ and surface states $N_{ss}$ of oxide film coatings on silicon are recorded in the following table for combinations with and without silicon nitride. It is to be noted that so far the existence of negative oxide charges could in general not be established when using oxide film coatings on silicon so that this possibility is not recorded in the following table. However, such negative oxide charges have proved possible in oxide coatings in other semiconductors.

In the table "—" means that the oxide charges or surface states are present to such a slight extent that their influence is negligible. "+" denotes that the oxide charges or the surface states are present to such an extent that their influence on the

TABLE

| Oxide without silicon nitride | | Oxide coated with silicon nitride | | Indication of the case |
|---|---|---|---|---|
| $\phi px$ | $N_{ss}$ | $\phi ox$ | $N_{ss}$ | |
| — | — | — | — | AA x |
| — | — | — | + | AB x |
| — | — | + | — | AC |
| — | — | + | + | AD |
| — | + | — | — | BA |
| — | + | — | + | BB x |
| — | + | + | — | BC |
| — | + | + | + | BD |
| + | — | — | — | CA x |
| + | — | — | + | CB x |
| + | — | + | — | CC x |
| + | — | + | + | CD x |
| + | + | — | — | DA x |
| + | + | — | + | DB x |
| + | + | + | — | DC |
| + | + | + | + | DD x |

electric properties is significantly noticeable. For each case of the combinations recorded in the table, a letter indication is given in the last column. The first letter relates to an oxide film coating without silicon nitride and the second letter relates to the same oxide with silicon nitride. "A" relates to few or no oxide charges and few or no surface states, "B" relates to few or no oxide charges and many surface states, "C" relate to many oxide charges and few or no surface states and "D" relates to many oxide charges and many surface states.

Where the parts of an oxide film coated with nitride and not coated with nitride have similar properties as regards oxide charges and surface states, it could be concluded that the local nitride film coating is superfluous. However, in case equal properties in both parts are desirable, it may be that such a nitride coating may be used on a part where locally further coatings are present, for example, metal coatings which without the presence of the nitride could influence the properties of the underlying oxide film coatings.

Of greater importance is the possibility to obtain parts of oxide film coatings with different properties. Not all the cases indicated in the table have been realized in the below examples to obtain oxide film coatings on silicon which are coated over part of their surface with a silicon nitride layer but where these are not described, the realization of similar cases which are denoted by changing the letters, has been described. The cases the realization of which has been described by way of example, are provided with an "$x$" in the last column of the table.

A few methods will now be described of manufacturing oxide film coatings with silicon, said oxide film coatings being coated for part of their surface with a silicon nitride layer. The surface on which the oxide film was provided, was a ⟨100⟩ plane but similar results can be obtained on a ⟨111⟩ plane or a ⟨110⟩ plane.

EXAMPLE I.

A monocrystalline silicon body is subjected to an oxidation treatment by heating in oxygen of atmospheric pressure at a temperature of 1,200° C. After 1 hour the oxygen is replaced by nitrogen of atmospheric pressure and the body is heated for another 5 minutes at 1,200° C. after which it is cooled. The resulting oxide film has a thickness of 0.2 micron. A layer of silicon nitride is then provided on the silicon oxide film by heating the body at 950° C. in a gas current of atmospheric pressure consisting of hydrogen with 30 percent by volume of ammonia and 1 percent by volume of silane ($SiH_4$). After 2 minutes pure hydrogen is led through after which the body is cooled. The resulting silicon nitride layer has thickness of 0.1 micron. A silicon oxide layer of 0.1 micron is provided in known manner on said silicon nitride layer by sputtering. After applying an etch-resistant masking pattern provided photographically by means of a photoresist, the silicon oxide layer provided on the silicon nitride is removed locally by etching in known manner with concentrated hydrofluoric acid after which it is rinsed with deionized water.

An etching treatment is then carried out in orthophosphoric acid ($H_3PO_4$) at a temperature of 230° C. The duration of treatment is 6 minutes which is sufficient to remove the nonmasked parts of the silicon nitride layer without any noteworthy action upon the underlying oxide film. Although the photoresist material is removed by the phosphoric acid at the temperature used, the nitride located below the oxide layer is maintained in the short etching time in which the phosphoric acid acts upon the silicon oxide originally covered by the photoresist. Then rinsing is carried out in the conventional manner in deionized water followed by drying.

The resulting oxide film coating involves many positive surface charges and few surface states, irrespective of the fact whether it is coated by the silicon nitride or not (case CC of the table).

It is to be noted that the resulting properties of the oxide film could depend upon the presence or the absence of impurities which are hard to establish. However, better reproducible results can be obtained by suitable aftertreatments, in which in some cases a change of the properties of the oxide film may occur as will become apparent from examples hereafter.

EXAMPLE II.

A body treated according to Example I was heated at 1,000° C. for 30 minutes in pure dry nitrogen of atmospheric pressure.

It was found that after cooling the oxide film coating now involves few surface charges and many surface states irrespective of the fact whether it was coated by the silicon nitride layer or not (case BB of the table).

EXAMPLE III.

A silicon body treated according to Example II is aftertreated at a temperature of 450° C. for 30 minutes in nitrogen of atmospheric pressure saturated with water vapor at 25° C. After this treatment it was found that the oxide film coating had experienced substantially no change of properties at the area where it was coated with the silicon nitride layer, that is to say, that it involves few oxide charges and many surface states. However, where the oxide film coating was not coated with the silicon nitride layer it was found that the oxide film coating involves both few surface states and few oxide charges (case AB of the table).

EXAMPLE IV.

A silicon body having an oxide film coating which is partly coated by nitride and is obtained according to Example I is afterheated in pure, dry oxygen at a temperature of 1,000° C. for 30 minutes after which it is cooled. It was found that the properties of the oxide film coating had changed everywhere. Whereas after the treatment according to Example I few surface states were present, said surface states were found to have increased everywhere to such an extent that they exert a considerable influence on the properties of the semiconductor body, irrespective of the fact whether the oxide film was coated with silicon nitride or not. Whereas after the treatment according to Example I the oxide film coating involves many positive oxide charges, it was found that after the oxygen treatment the quantity of oxide charges at the area where the oxide film is free from silicon nitride, was also large but in the oxide film coating below the silicon nitride layer the quantity of oxide charges appeared to have reduced to such an extent that they substantially exert no influence on the properties of the silicon body (see case DB of the table).

EXAMPLE V.

A silicon body having an oxide film which is partly coated by a silicon nitride layer is obtained by using the method according to Example IV in which the last treatment is carried out in oxygen at a temperature or 1,000° C. for 30 minutes. The resulting body is heated at a temperature of 450° C. for 30 minutes in moist nitrogen (dew point 25° C.) of atmospheric pressure.

It is found that after this treatment the properties of the oxide film coating, where it is coated with the silicon nitride layer, have not changed substantially, whereas, while maintaining many oxide charges, the surface states in the oxide film coating where it is not coated with the nitride, have reduced to such an extent that they exert only a sight influence (see case CB of the table).

EXAMPLE VI.

The starting material is a silicon body having an oxide film coating partly coated by nitride obtained according to Example IV in which in the last step the heating in the oxygen atmosphere has taken place at 1,000° C. for 30 minutes. Aluminum is vapor-deposited on the oxide surface which is partly coated with aluminum-nitride by vapor-deposition in vacuo. The silicon body with said coatings is then heated at a temperature of 450° C. for 30 minutes in an atmosphere of $N_2$. After this treatment the aluminum may be removed, if desired, from the whole surface or from a part thereof, for example, by means of a suitable etching treatment, for example, in orthophosphoric acid (85 percent) of room temperature, if desired, while using a masking pattern provided photographically.

Whereas after this last treatment the situation with few oxide charges and many surface states is maintained in the oxide film parts coated with nitride, it is found that in the surface parts with oxide film coating which is not coated with silicon nitride and is coated with a layer of aluminum during the last heating step, many positive oxide charges and few surface states are present (case CB of the table).

EXAMPLE VII.

A semiconductor body consisting of silicon is heated in oxygen of atmospheric pressure at 1,200° C. for 1 hour. The oxygen is then replaced by nitrogen and the body is heated therein for another 5 minutes at 1,200° C. An oxide film, thickness 0.2 micron, has formed at the surface of the silicon body. The body is then exposed at 450° C. for 30 minutes to an atmosphere of nitrogen, which, at 25° C., has been saturated with water vapor. A layer os silicon nitride, thickness 0.2 micron, is then provided on the oxide film. For this purpose a method is used in which the deposition takes place in a space which is filled with a gas mixture with a pressure of 3 mm. mercury and consists of 50 percent by volume of hydrazine, ($H_2N$-$NH_2$) and 50 percent by volume of silane (silicon hydride, $SiH_4$) and mercury vapor of approximately $10^{-3}$ Torr originating from a mercury reservoir at room temperature. The silicon body is heated at 50° C. so as to prevent mercury from depositing on its surface. By irradiating the gas mixture with ultraviolet light originating from a low-pressure mercury lamp, a chemical reaction takes place in which the silicon nitride is formed from the hydrazine and the silicon hydride. After irradiating for approximately 1 hour, the above-mentioned layer thickness is obtained. This method is also described and claimed in copending application, Ser. No. 730,436, filed May 20, 1968. With the use of a suitable photoresist pattern the nitride layer is etched away locally with a mixture of 10 parts by volume of a saturated solution of $NH_4F$ and 1 part by volume of 50 percent hydrofluoric acid. Actually it has been found that, when the silicon nitride is provided at low temperature, it may be removed with the last-mentioned etchant. Since silicon nitride has an index of refraction quite different from that of silicon oxide it is clearly observable when the silicon nitride is removed from the parts not coated by the photoresist, after which the body is rinsed with deionized water. The photoresist is then removed in a conventional manner, followed by rinsing and drying.

Irrespective of the fact whether the oxide film is coated with nitride or not, it involves few oxide charges and few surface states (Case AA of the table).

EXAMPLE VIII.

Starting material is a silicon body which is provided with an oxide film which is partly coated with a silicon nitride layer and has been obtained by means of a method according to Example VII. The body is heated in oxygen at 500° C. for 30 minutes. After this treatment it is found that the properties of the oxide film below the nitride have not varied noteworthily, that is to say, it involves few oxide charges and few surface states. On the other hand it is found that many positive oxide charges and few surface states are formed in the surface parts where the oxide is not coated with the nitride. (case CA of the table).

EXAMPLE IX.

Starting material is a silicon body which is provided with an oxide film which is coated partly with a silicon nitride layer obtained in the manner as described in Example VII. The body is heated in oxygen of atmospheric pressure, but this time at 800° C. for 10 minutes. In this case also the properties of the parts of the oxide film below the nitride layer have not varied noteworthily after this last treatment, but the parts of the oxide film which are not coated with the silicon nitride are found to involve many positive oxide charges and many surface states (case DA of the table).

EXAMPLE X.

A silicon body having an oxide film coating which is partly coated by a nitride layer obtained according to Example VII is heated in nitrogen of atmospheric pressure at a temperature of 800° C. for 2 hours. Both at the area of the nitride layer and at the area where the nitride layer has been removed from the oxide layer, the oxide film involves few oxide charges and many surface states (case BB of the table).

EXAMPLE XI.

A silicon body having an oxide film coating which is locally provided with a nitride layer and which is obtained according to Example X is heated at a temperature of 450° C. for 30 minutes in nitrogen of atmospheric pressure saturated with water vapor at 25° C. Whereas below the nitride layer the number of oxide charges and the number of surface states has remained large, few oxide charges and few surface states are to be found on the surface parts where the nitride layer has been removed (case AB of the table).

EXAMPLE XII.

A silicon body is provided with an oxide film coating by heating the body in oxygen of atmospheric pressure at 1,200° C. for 1 hour. The oxygen is then replaced by nitrogen of atmospheric pressure, after which the body is heated at 1,200° C. for another 5 minutes. The resulting oxide film has a thickness of 0.2 micron. The body is then treated in pure oxygen of atmospheric pressure at 700° C. A silicon nitride layer is then provided on the oxide in the manner as described in Example VII. The thickness of the resulting nitride layer is 0.2 micron. An etch-resistant masking pattern is photographically applied on the nitride layer, after which etching is carried with the $NH_4F$-HF solution in the manner as described in Example VII. The body is rinsed with deionized water and the etch-resistant masking material is removed. The oxide film coating involves many positive oxide charges and many surface states both below the nitride layer and at the area where the nitride layer has been removed (case DD of the table).

EXAMPLE XIII.

A silicon body is provided with an oxide film coating which is coated partly with silicon nitride by means of a method as described in Example XII. This body is heated at 450° C. for 30 minutes in an atmosphere of nitrogen of atmospheric pressure which is saturated with water vapor at 25° C. The result of this latter thermal treatment is that below the silicon nitride layer the situation with many positive oxide charges and many surface states is maintained. In the surface parts where the silicon nitride had been removed, many positive oxide charges but few surface states are found to be present (case CD of the table).

A few examples will now be described of semiconductor devices in which oxide film coatings are partly coated with nitride, a different action of the oxide film on the underlying semiconductor material being obtained.

Figure 9:
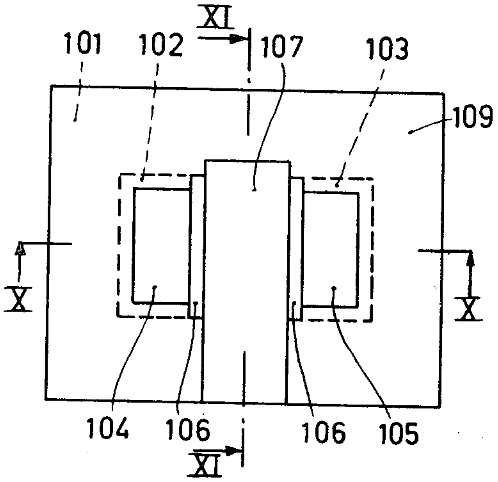
FIG. 9 is a plan view and FIG. 10 is a cross-sectional view of a MOS-transistor taken on the line X—X of FIG. 9.
Figure 10:
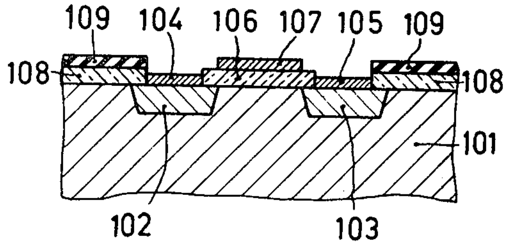

FIGS. 9, 10 and 11 show a MOS-transistor in which two regions of opposite conductivity types 102 and 103, respectively, serving as source and drain electrodes, respectively, are provided in a semiconductor material of a given conductivity type 101, for example, by diffusion of a suitable impurity. The source and drain electrodes 102 and 103, respectively, are provided with metal contact layers 104 and 105, respectively. An oxide film part 106 on which the gate electrode is provided in the form of a vapor-deposited metal strip 107 is arranged between said contact layers. This metal strip is extended beyond the actual gate region between the source and drain electrode, for example, for an easier provision of an electric connection.

Three types of silicon MOS-transistors of the configurations shown in FIGS. 9 to 11 will now be described in greater detail. In two of these types the semiconductor material 101 is P-type silicon and the regions 102 and 103 are N-type silicon. The first type of MOS-transistor has a characteristic of the type as is denoted by the solid-line curve 21 in FIG. 2, a so-called "enhancement-mode NPN-silicon MOST," in which at a zero gate voltage no conductive channel is present between the source and drain electrode. The second type has a characteristic which corresponds to the solid-line curve 26 in FIG. 4, a so-called "depletion-mode NPN-silicon MOST," in which such a channel is present indeed at a zero gate voltage, which channel is gradually pinched off by applying a negative gate voltage.

Figures 11A, 11B:
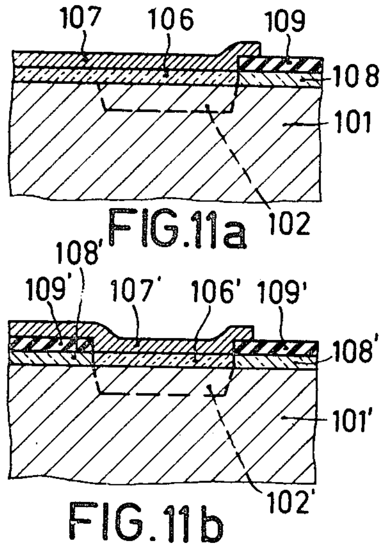
FIG. 11A and FIG. 11B are longitudinal cross-sectional views taken on the line XI—XI of FIG. 9 of two possible embodiments of the MOS-transistor shown in FIGS. 9 and 10.

In the case of the "enhancement-mode NPN MOST" preferably the fewest possible positive oxide charges should be present in the oxide film part 106 while also preferably the fewest possible surface states should be present to obtain a better characteristic. In addition it is desirable to restrict the action of the MOS-transistor as much as possible to the gate region between the source and drain electrode and to avoid the possibility of leakage between the source and drain electrodes beyond the gate region as much as possible. For this purpose, the oxide film part 108 beyond the gate electrode should preferably be given other properties than the oxide film part 106 serving as a dielectric below the gate electrode, namely few oxide charges and many surface states, so that the conductivity properties at the surface are deteriorated. In order to obtain this difference in properties a silicon nitride layer 109 is used which is located on the part 108 of the oxide film beyond the gate electrode 107, while the part 106 of said oxide film does not contain the nitride layer. The part of the oxide film which is not coated with nitride may extend further below the metal layer 107 also in as far as this metal layer is located beyond the actual gate region between the source and drain electrode (see FIG. 11A), but it is alternatively possible to restrict the part 106′ of the oxide layer not coated with the silicon nitride layer 109′ to the actual gate region, the metal layer 107′ which forms the gate electrode extending beyond that region and across the part 108′ of the oxide film coated with the silicon nitride 109′ as shown in FIG. 11B, in which the reference numerals correspond to the reference numerals of FIG. 11A but with the addition of an accent. The properties of the oxide film coated partly with silicon nitride are chosen in accordance with the case AB of the table and may be obtained, for example, by removing the oxide masking used after diffusing the donor for the formation of the regions 102 and 103 and providing a new oxide film partly coated with silicon nitride and treating it in accordance with Example III.

For the "depletion-mode NPN-silicon MOST" preferably this part of the oxide film coating 106 should likewise contain few surface states but in this case many positive oxide charges at the area of the gate region in such manner that without applying a gate voltage, a conductive N-type channel is present at the semiconductor surface, which channel forms a conductive connection between the source and drain electrodes 102 and 103, respectively. However, in this case similar properties of the oxide film coating beyond the surface part coated by the metal 107 would provide for a leakage path between the source electrode and the drain electrode which cannot be influenced by the gate voltage. The part 108 (108′) of the oxide film coating coated with the silicon nitride film 109 (109′) is therefore given few oxide charges and many surface states in accordance with case CB of the table. For that purpose, after the formation of the regions 102 and 103 and removing the oxide film masking which has been used for the diffusion treatment, the oxide film coating partly covered with silicon nitride may be provided and treated in accordance with Example V.

When the MOS-transistor is of the PNP-type, that is to say that the bulk material of the silicon body 101 is N-type silicon and the regions 102 and 103 are P-type silicon, no conductive channel between the regions 102 and 103 will generally occur at a zero gate voltage, since so far in oxide films on silicon positive oxide charges, but normally no negative oxide charges are found. It is to be noted that such negative oxide charges are possible in principle and have been found indeed, for example, in silicon oxide film coatings on germanium. In the present case only the possibility of the existence of positive oxide charges is considered, so that in the PNP-MOS-transistor at a zero gate voltage no conductive channel is present. The MOS-transistor therefore cannot be of the "-depletion-mode" type but only of the "enhancement-mode" type. The presence of positive oxide charges means that the MOS-transistor will become conductive only at a strongly negative voltage. Since in general it is desirable that a conductive channel is formed at a gate voltage which lies near to the value zero, the presence of (positive) oxide charges in the part 106 of the oxide film which lies below the gate electrode is to be avoided as much as possible. Furthermore it holds in this case also that better characteristics are obtained when the gate region contains few surface states only. In order to prevent as much as possible conduction beyond the gate electrode region through an inversion channel, for example, by negative charge on the oxide film (see the thesis by Dr. E. Kooi, pp. 46–48, section 2.11.2) or by a negatively biased conductive layer on the oxide, it is of advantage that the part 108 of the oxide film involves many surface states. For example, the part 106 of the oxide film coating is free from the nitride layer where as the part 108 is coated with the silicon nitride layer 109. For that purpose the method described in Example III may be used in which below the nitride layer many surface states and few oxide charges are obtained. (case AB of the table).

In the present case the effect of preventing a conductive channel beyond the gate region is also obtained when instead of or in addition to the surface states positive oxide charges are present. To obtain the two latter cases, a silicon nitride layer may be used on the part of the oxide film on the gate region and no silicon nitride on the part beyond said gate region, use being made of the method as described in Example VIII (case CA of the table) or in Example IX (case DA of the table).

The use in transistors of oxide film coatings with parts which are coated with a silicon nitride layer and parts which are free from such a silicon nitride layer will now be described.

Figure 12:
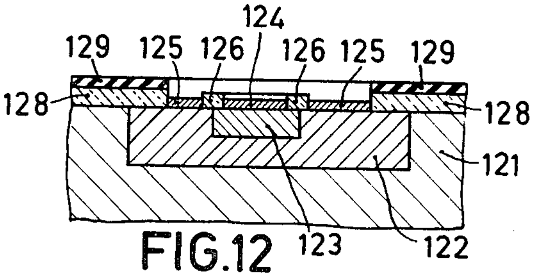
FIGS. 12–14 are cross-sectional views of planar transistors.

FIG. 12 is a diagrammatical vertical cross-sectional view of such a transistor. It comprises a collector region 121 in which a base region 122 of the opposite conductivity type is provided by diffusion, in which base region an emitter region of the same conductivity type as the collector region 121 is provided, likewise by diffusion. A connection to the collector region 121 is located, for example, at the lower side of the semiconductor body (not shown in FIG. 12). On the surface of the semiconductor body used in this case an oxide film is provided in which windows are formed for an emitter contact 124 and a base contact 125 surrounding the emitter, both consisting of vapor-deposited metal. The oxide film coating consists of a part 126 located between the emitter contact 124 and the base contact 125 and covers the place where the emitter-base junction emerges on the semiconductor surface. On the outside of the base contact 125 a part 128 of the oxide film is located which part 128 covers the part of the semiconductor surface where the base-collector junction emerges at the surface of the semiconductor body. This part 128 itself is coated with a silicon nitride layer 129 while the part 126 does not have such a nitride layer.

For a good operation of the transistor it is desirable that the charge carriers injected by the emitter can recombine as little as possible before they reach the collector-base junction. It is therefore desirable that at the area where the emitter-base junction emerges at the surface, the possibilities of recombination of electrons and holes are as small as possible. Furthermore, the formation of a conductive channel below the part 126 of the oxide film either in the emitter region 123 or in the base region 122 could mean a leakage current between the emitter and the base which reduces the amplification factor. The part 126 of the oxide film should therefore involve preferably few surface states and preferably also few oxide charges. As already described above for the reversely biased PN-junctions, charge displacements on the insulating layer above the semiconductor surface may take place near the collector-base junction due to electrostatic forces. Such charge displacements may result in instabilities and possibly even in inversion on one or both sides of the PN-junction. Such an inversion will most easily occur at the area with the lowest degree of doping as already described above. Usually this lowest degree of doping will be on the collector side, since at the base surface generally a highly doped region is obtained by the diffusion process used. In this case many surface states are favorable for counteracting such an inversion and for compensating charge displacements on or in the insulating material. Such an inversion could lead to a strong leakage current between the base and collector.

The use of silicon as a semiconductor material will now be described in greater detail, two cases being described, namely a PNP-transistor and an NPN-transistor. In the present case it is furthermore assumed that if oxide charges are present, said charges are always positive.

In the case of an NPN-transistor in FIG. 12 the emitter region 123 is of the N-type, the base region 122 is of the P-type and the collector region 121 is of the N-type. As already described above, it is desirable that the part 126 of the oxide film coating involves few oxide charges and few surface states. As regards the part 128 it should be prevented that, by charge displacement on or in the insulating coating, an inversion channel could be formed on the collector region 121. This channel formation on the collector region 121 can be counteracted, for example, by using many oxide charges in the part 128 of the oxide film. In the part 128 positive oxide charges are admissible in that case, since inversion in the base region 122 will usually not occur due to its high doping level. Such oxide charges will counteract inversion at the surface of the collector region 121, which in this case is of the N-type which prevents an inconveniently strong leakage current from the base to the collector or even to parts of the semiconductor device located further on, for example, in the case of an integrated circuit. Such inversion is further counteracted if the part 128 involves many surface states. Although at said PN-junction generation of electrons and holes can take place owing to said surface states, which will slightly increase the leakage current, said increase remains within tolerable limits and the small drawback does not offset the above described advantage. When the part 128 of the oxide film coating below the silicon nitride 129 involves many surface states, the presence of oxide charges therein may be dispensed with. When the part 126 of the oxide film is not coated with the silicon nitride and involves few oxide charges and few surface states, the part 128 may be coated with the silicon nitride layer 129 and it may be given other properties, for example, many surface states and few oxide charges (case AB of the table). For providing and treating the oxide film coating partly coated with nitride a method may be used, for example, as described in Example III or Example XI. It is alternatively possible to coat the part 126 with silicon nitride and not to coat the part 128, the part 128 involving many oxide charges and few surface states (case CA of the table) or many oxide charges and many surface states (case DA of the table). For this purpose may be used, for example, the method as described in Example VIII and according to Example IX, respectively, for providing the oxide film which is partly coated with nitride.

In the case of a PNP-transistor the emitter region 123 is of the P-type the base region 122 is of the N-type and the collector region 121 is of the P-type. In order to counteract inversion at the surface of the P-type collector region 121, the part 128 of the oxide film coating should preferably involve few positive oxide charges and many surface states. As in the above described PNP-transistor, the part 126 of the oxide film coating should preferably contain few surfaces states, while many oxide charges, as already described above, are less desirable. In manufacturing the transistor, the method as described in Example III may be used, for example.

The problem of forming inversion channels at parts of the surface where these channels are undesirable, is known in the planar semiconductor technology. In order to counteract such an inversion it has already been proposed to provide a metal layer locally on the oxide film coating and to give said metal layer such a voltage that majority charge carriers are drawn from the underlying region to the surface. Another method in which a conductive channel possibly formed by inversion, is locally interrupted at the semiconductor surface, which interruptions are also termed "channel stoppers" or "channel stopping zones," is the local diffusion of an impurity of the same type as the impurity which determines the conductivity properties of the semiconductor material at the area in question. In this manner, a zone is formed at the surface of a region with low doping concentration having the same conductivity type but a high concentration of impurities. The said channel stoppers are often annular and surround a region of opposite conductivity type, for example, to better insulate said region. Such an annular channel stopper is sometimes termed "guard ring." When inversion is locally counteracted by means of the above-mentioned suitably biased metal layer on the oxide layer, such a metal layer has the drawback that conducting tracks, if any, over the surface of the insulating layer to a contact place within the ring have to cross said metal ring in an insulating manner. The formation of such a ring by means of a diffusion process may in certain cases require an additional step if not at another place diffusion of the relative impurity is also desired. Moreover, in the case in which the oxide film parts formed or used in the diffusion processes are at least partly maintained, the part of the oxide film which is formed on the channel stopper during the diffusion step may be very thin, so that short-circuiting with a conductor possibly provided across said part of the oxide film, for example, for connecting the emitter, is possible. It is an object of the present invention to obtain the channel-stopping effect by using an oxide film which is locally given other properties than the adjacent parts of the oxide film coating.

According to this aspect of the present invention, such a channel-stopping zone can be realized on an N-type material by choosing the oxide film coating to be so as to involve many surface states and/or many positive oxide charges, while for such a zone on a P-type material at said area an oxide film coating may be chosen which involves many surface states and/or, if possible, many negative oxide charges. The adjacent parts of the oxide film coating may then be given different properties. The channel-stopping zone, obtained by said choice of the properties of the oxide film coating on the surface of the channel-stopping zone, may be annular and/or adjoin a channel-stopping region which is obtained in a different manner, for example, in known manner by diffusion or induced by means of a suitably biased conductor on the insulating coating. In this case too the channel stopper is preferably realized by means of an oxide film coating which is partly coated with a silicon nitride layer and is partly not coated with a silicon nitride layer. In principle, however, other methods are also possible, for example, as described in the above mentioned thesis by E. Kooi. The present aspect of the invention will be further described with reference to FIGS. 13 and 14.

Figure 13:
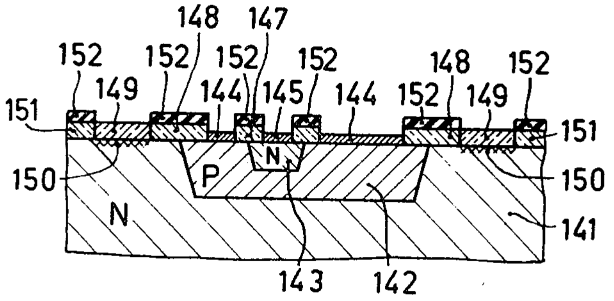

FIG. 13 shows a planar NPN-transistor in which in semiconductor material of the N-type a base region 142 of the P-type and therein an emitter region 143 of the N-type is provided by diffusion. The collector region 141 may be provided with an ohmic contact in known manner (not shown). The base region 142 is provided with an ohmic contact 144 which surrounds the emitter 143. The emitter 143 is provided with an ohmic contact 145. The two contacts 144 and 145 may be provided in known manner, for example, by vapor-deposition. The surface of the semiconductor supports an oxide film in which windows are provided for the contacts 144 and 145. This oxide film coating comprises a part 147 which is located between the contacts 144 and 145 and covers the surface parts where the emitter-base junction emerges at the semiconductor surface. It furthermore comprises a part 148 which adjoins the base contact 144 and covers the surface region where the base-collector junction emerges at the surface. The part 148 is now surrounded by an annular part 149 of the oxide film coating which has such properties that a channel-stopping zone 150 is formed at the surface of the semiconductor material which is shown diagrammatically in FIG. 13 by a crossed shaded area. A part 151 of the oxide film coating adjoins the outside of the annular part 149 and may have different properties than said part 149.

To obtain the above-mentioned difference in properties, a silicon nitride layer 152 may be used which covers the parts 147 and 151 of the oxide film coating, but does not cover the annular part 149. When the semiconductor material consists of silicon the oxide film which is partly coated with nitride, may be provided after removing the maskings used in the preceding diffusion processes for the formation of base and emitter by means of a method as described in Example VIII (case CA of the table), or by means of a method as described in Example IX (case DA of the table). The parts 147, 148 and 151 which are coated with the silicon nitride layer 152 involve few oxide charges and few surface states, while the part 149 of the oxide film coating which is not covered with silicon nitride involves either many positive oxide charges and few surface states or many positive oxide charges and many surface states. In both cases, inversion at the surface of the N-type collector region 141 below the part 149 is counteracted.

It is alternatively possible to use a silicon nitride layer on the part 149 of the oxide film coating, while the parts 147, 148, 151 are not coated by said silicon nitride layer. For providing the oxide film coating which is partly coated with nitride, the method as described in Example III may be used. The parts 147, 148 and 151 in that case also involve few oxide charges and few surface states, while the region 149 involves few oxide charges and many surface states (case AB of the table). These surface states counteract the formation of a conductive inversion channel.

Figure 14:
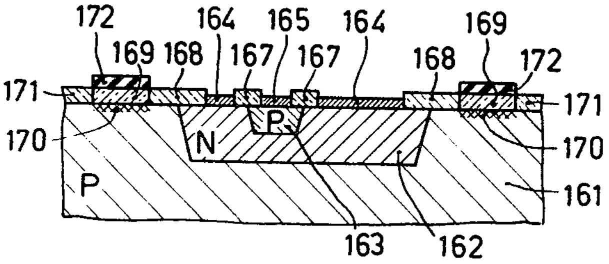

FIG. 14 relates to a planar transistor of the PNP-type. The region 161 is of the P-type and serves as the collector of the transistor for which purpose it is provided with an ohmic contact in known manner (not shown). An N-type base region 162 and a P-type emitter region 163 are obtained in known manner by diffusion processes. A base contact 164 is provided around the emitter which is provided with an ohmic emitter contact 165. The contacts 164 and 165 may be provided in known manner by vapor-deposition of a suitable metal, for example, aluminum.

The semiconductor surface has an oxide film in which windows are provided at the area of the contacts 164 and 165. The oxide film comprises a part 167 between the emitter contact 165 and the base contact 164 which covers the emitter-base junction where said junction emerges at the semiconductor surface, a part 168 around the base contact 164 which covers the base-collector junction where said junction emerges at the semiconductor surface, an annular part 169 around the part 168 to obtain a channel-stopping zone 170, and a part 171 which surrounds the part 169. The part 169 is coated with a silicon nitride layer 172 while the parts 167, 168 and 171 of the oxide film are not coated with silicon nitride. The parts 167, 168 and 171 involve few oxide charges and few surface states. If the emitter region 163 is sufficiently highly doped, it is allowable that the part 167 contains positive oxide charges. If also the parts 168 and 171 contain many of these oxide charges, the base region across the collector region - if said two parts would adjoin each other, - would be extended so that not only the danger exists that the base is short-circuited with an N-conductive region which is located further on, for example, in an integrated circuit, but it also means an increase of the surface area of the PN-junction between the base and the collector, which would involve an unfavorably high collector capacity. The channel-stopping zone 170 is obtained in that the part 169 of the oxide film which is coated with the silicon nitride layer 172 involves few oxide charges and many surface states. The oxide film coating partly coated with nitride, may be obtained, in the case the regions 161, 162, 163 consist of silicon, by means of a method according to Example III (case AB of the table) or by means of the method as described in Example V or VI to obtain the case CB of the table. In the latter case the aluminum may be locally removed where this is desirable by means of a known suitable etching method. In addition, the provision of the aluminum according to Example VI may also be used for providing ohmic contacts 164 and 165 and an etch-resistant masking may be used in etching away the aluminum in the windows and possibly also at other places where a conductive layer is desirable, for example, for connecting said ohmic contacts.

It is to be noted that due to the difference in expansion of silicon nitride and the oxide in the case of temperature variations, it is desirable to choose the silicon nitride layer to be not too wide (width is the horizontal dimension in FIGS. 13 and 14), for example, not wider than 100 microns, preferably not wider than 20 microns, or, if desired, to divide it into strips which are separated from each other. For example, it is desirable to choose the part of the silicon nitride layer 152 which is located on the part 148 or 149 of the oxide film in the transistor shown in FIG. 13 to be not too wide or to interrupt it. The same applies to the nitride layer 172 of the transistor shown in FIG. 14.

In the above-described embodiments of normal transistors and MOS-transistors, reference was made to method examples, which all related to the provision of a fresh oxide film after possible diffusion processes. However, it is alternatively possible to use the oxide film as it is obtained after the last diffusion process, which may already be provided over part of its surface with a silicon nitride layer as will be described in detail hereinafter by means of an example of manufacturing a planar silicon NPN-transistor with reference to FIGS. 15 and 16.

A body of N-type silicon is heated for 15 minutes at a temperature of 1,175° C. in an atmosphere consisting of a mixture of steam (dew point 95° C.) and nitrogen of atmospheric pressure. A silicon oxide film, thickness 0.37 micron, is formed on the surface of the silicon body by oxidation. A window is etched in known manner in the said oxide film at the area where the base region is to be formed. For this purpose a photoresist method may be used in known manner, while using a photoresist which masks the parts of the oxide film outside the window during the etching process with a mixture of concentrated solutions of HF and $NH_4F$.

The semiconductor body is then heated in the presence of boron oxide ($B_2O_3$) at a temperature between 950° and 1,000° C. in a nitrogen atmosphere, for example, for 10 minutes, boron in oxide form being deposited in the window. The body is then postheated in the absence of the boron oxide source at the same temperature in an inert atmosphere, for example, in nitrogen for 10 minutes, after which the boron at the area of the window is diffused into the silicon body, for example, at 1,200° to 1,250° C. for approximately 30 minutes in a nitrogen atmosphere to which temporarily water vapor may be added, if desired. A P-type region 202 which is destined for the base of the transistor to be manufactured (see FIG. 15) is formed at the area of the window in the N-type silicon 201 which is destined for the collector of the transistor to be manufactured. A new oxide film part 203 has grown in the window which contains silicon and boron and adjoins the original oxide film part 204. In the oxide film part 203 a window 205 is provided at the area where the emitter of the transistor to be manufactured is to be formed, in which again the above mentioned photoetching process may be used.

The body is then heated between 950° and 1,000° C. in a mixture of nitrogen and vapor of phosphorus oxychloride ($POC1_3$), for example, for 8 to 10 minutes. Phosphorus diffuses to a very small depth into the semiconductor material at the area of the window 205 while also at the surface a phosphorus silicate glass is formed which is removed by treating with a mixture of 15 parts of 50 % HF, 10 parts of 70 % $HNO_3$, and parts of water at a temperature of 90° C.

A layer of silicon nitride 206 is then provided by heating the body in a gas mixture consisting of hydrogen, ammonia and silane as described in Example I, at a temperature of 000900 C. for 12 minutes. The silicon nitride layer formed has a thickness of approximately 0.2 micron, A silicon dioxide layer 207 of approximately 0.3 micron thickness is provided on the silicon nitrode layer by sputtering. While using a photoetching method, an etch-resistant masking layer is provided on the sputtered oxide in known manner by means of a photoresist, which masking layer does not cover the surface of the sputtered oxide at the area of the original window for the boron diffusion. By etching with a mixture of concentrated HF and $NH_4F$ solutions the sputtered silicon oxide layer 207 on the non-masked surface part is removed, the silicon nitride layer 206 being exposed at that area.

Figure 15:
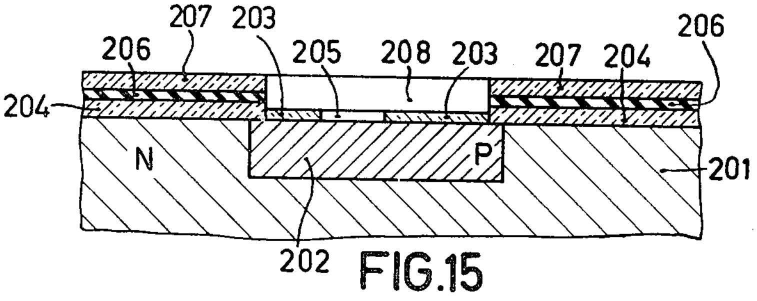

The silicon nitride in the window 208 is then removed with heated phosphoric acid as described in Example I, which treatment is terminated when the semiconductor surface in the window 205 and the part 203 of the oxide film is exposed, after which it is rinsed with deionized water in which the stage shown in FIG. 15 is reached. The thin zone with the diffused phosphorus in the part of the semiconductor surface at the area of the window 205 is not shown in FIG. 15.

Figures 16, 17, 18, 19:
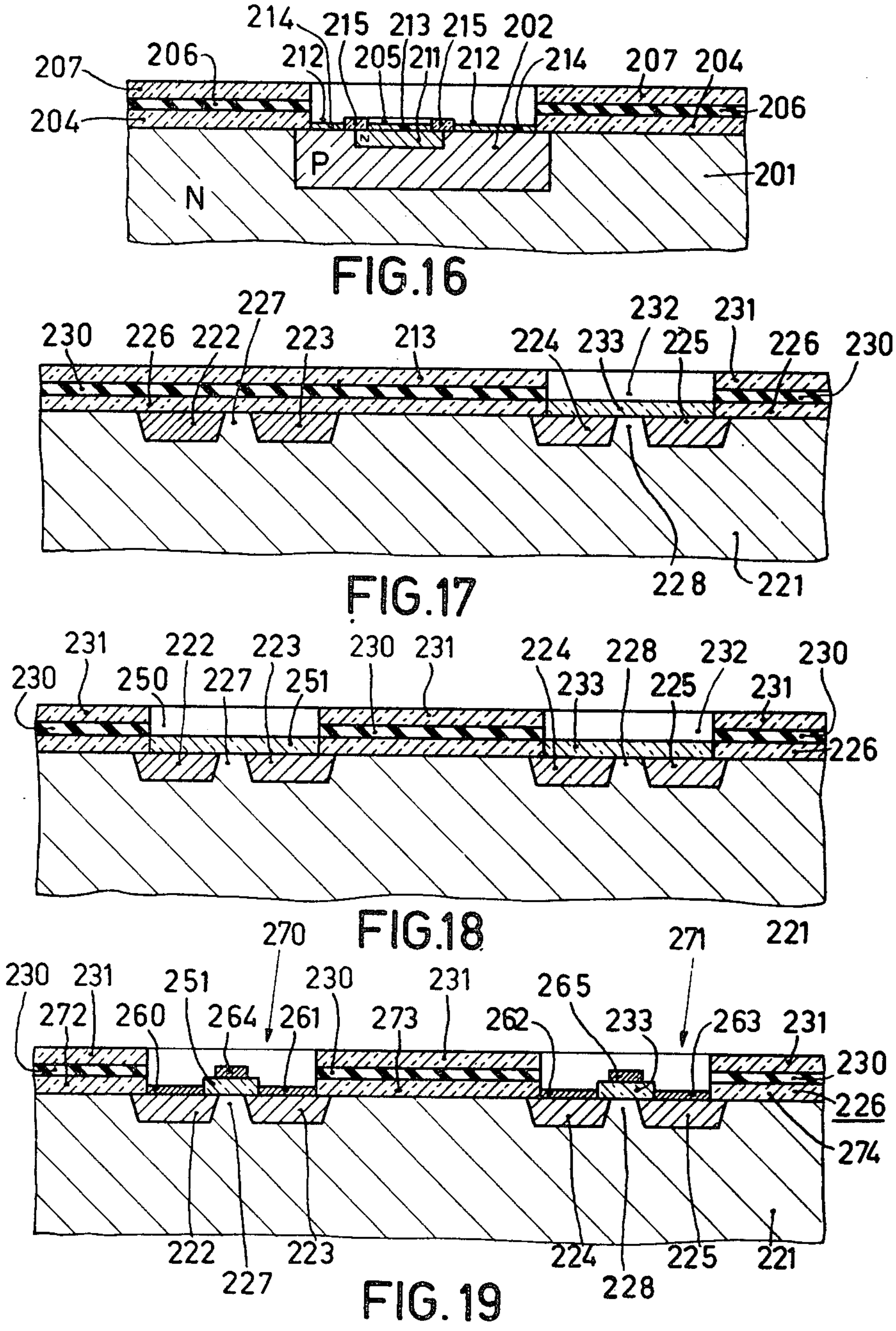

The assembly is then heated once again at a temperature between 950° and 1,000° C. in a nitrogen atmosphere for further diffusing phosphorus, for example, for 10 to 15 minutes, the N-type emitter region 211 being formed (see FIG. 16).

An annular window 212 is provided in known manner in the part 203 of the oxide film at the area where the base region 202 emerges at the surface, and an emitter contact 213 and a base contact 214, respectively, are provided in the windows 205 and 212, for example, of vapor-deposited aluminum. A collector contact may also be provided already at this stage in known manner (not shown in FIG. 16). As regards its geometrical construction, the transistor is ready. The PN-junctions are coated with oxide film at the region where they emerge at the semiconductor surface, namely with the part 204 on the base-collector junction and the part 215, which has remained from the part 203 after providing the window 212, on the emitter-base junction. It has been found that the two oxide film parts 204 and 215 involve few oxide charges and many surface states. As already described above, many surface states are favorable at the base-collector junction. Many surface states at the emitter-base junction, however, reduce the amplification factor.

An aftertreatment in moist nitrogen is then carried out in the manner as described in Example III. It is then found that the properties of the part 204 of the oxide film which is coated with the silicon nitride layer 206 have not changed essentially. The part 215 of the oxide film which coats the emitter-base junction, however, now involves few oxide charges and few surface states, which is favorable for a good emitter efficiency (case AB of the table).

By means of treatments in which an oxide film on a semiconductor is partly coated with a silicon nitride layer, more than two types of oxide film parts with mutually different properties can be obtained, for example, by different treatments in which the silicon nitride layer has not the same form. For example, after a treatment with a silicon nitride layer which covers the oxide film over part of its surface, silicon nitride may be provided again, if required after wholly or partly having removed the previous silicon nitride layer, in order to cover parts which were previously not covered with silicon nitride, while other parts are not covered. However, it is alternatively possible to provide silicon nitride only once and to remove said nitride layer partly after a preceding thermal treatment with the use of a partial coating of the oxide film with the nitride layer and then to use again a thermal treatment. Such a single provision of the silicon nitride has the advantage that the treatment steps are simpler.

The use of more than two types of oxide film parts with mutually different properties is of particular importance in integrated circuits, where various semiconductor circuit elements are used, but is in principle possible also with a single circuit element. Due to the present invention the number of possibilities of adapting the properties of the oxide film part to the desired properties of the various circuit elements or parts of circuit elements is increased.

The manufacture of two MOS-transistors of different characteristics on the same semiconductor substrate, for example, as part of an integrated circuit, will now be described, which manufacture will also be explained with reference to FIGS. 17 to 19.

Starting material is a semiconductor body of P-type silicon 221 with a resistivity the body in a gas mixture consisting of hydrogen, ammonia and silane as described in this purpose first an oxide layer is formed by heating in steam as described above, succeeded by the provision of windows by means of a known photoresist method. The body is then heated between 950° and 1,000° C. in a mixture of nitrogen and phosphorus oxychloride for 8 minutes after which the formed phosphorus silicate glass is removed from the windows by treating with a mixture of 15 parts of 50 % HF, 10 parts of 70 % $HNO_3$ and 300 parts of water as described above. This mixture etches the formed phosphorus silicate glass much more rapidly than the thermally grown oxide. When the semiconductor surface in the windows is exposed, the body is rinsed in deionized water. The body is heated in nitrogen for another 10 minutes, after which it is heated in oxygen at 1,200° C. for 1 hour, and in nitrogen at 1,200° C. for 5 minutes, an oxide film 226 being formed all over the surface. At the areas of the original windows, four N-type regions are formed, the regions 222 and 223 and the regions 224 and 225 of which are located near each other. The regions 222 and 223 are destined for the source and drain electrodes of an "enhancement-mode" MOS-transistor and the regions 224 and 225 are destined for source and drain electrodes of a "depletion-mode" MOS-transistor. The gate regions 227 and 228, respectively, of the two MOS-transistors are located between the regions 222 and 223 and the regions 224 and 225, respectively.

On the oxide film 226 a silicon nitride layer 230 is provided in a thickness of 0.2 micron at a low temperature (50° C.) from silicon hydride and hydrazine in the presence of mercury vapor under the influence of ultraviolet radiation as described in Example VII. A layer 231 consisting of silicon dioxide, thickness, for example, 0.2 micron, is then provided on the silicon nitride layer 230 by sputtering.

A window 232 is etched in the silicon oxide layer 231 and the silicon nitride layer 230 by means of a known photoetching process using a mixture of concentrated solutions of $NH_4F$ and HF which window is located above the channel region 228 and the adjoining PN-junctions with the source and drain electrodes 224 and 225 of the "depletion-mode" MOS-transistor to be manufactured. The etching treatment is continued until the silicon nitride layer 230 in the window 232 has disappeared which can be established visually by the difference in indices of refraction of the nitride and the underlying oxide of the oxide film 226. Then there is rinsed with deionized water in which the stage shown in FIG. 7 is reached. The oxide film 226 is maintained also at the area of the window 232 but the relative oxide film part 233 is not coated with the silicon nitride film 32 in contrast with the other parts of the oxide film 226.

The assembly is then heated in oxygen at 525° C. for 30 minutes. After this treatment the oxide film part 233 involves many surface states and many oxide charges, whereas the remaining parts of the oxide film 226 which were coated with the silicon nitride layer 230 involve many surface states and few oxide charges.

In the manner as hereinbefore described for obtaining the window 232, a second window 250 is provided in the silicon oxide layer 231 and the silicon nitride layer 230, which is located above the gate region 227 and the adjacent PN-junctions with the source and drain electrodes 222 and 223 of the "enhancement-mode" MOS-transistor to be manufactured, the part 251 of the oxide film 226 being maintained, and, like the oxide film part 233, being not coated with silicon nitride. Then the stage shown in FIG. 18 is reached.

In the oxide film parts 251 and 253 windows are etched for providing contacts on source and drain electrodes of the two transistors after which in said windows aluminum contacts 260, 261, 262 and 263 are provided on the parts 222, 223, 224 and 225, respectively by vapor deposition and removal from the remaining free surface parts with the use of an etch-resistant mask.

The assembly is then subjected to a thermal treatment in a mixture of atmospheric pressure of water vapor with dew point of 25° C. and nitrogen. The temperature of the treatment is 450° C. and the duration of the treatment is 30 minutes. The gate electrodes 264 and 265 are then provided, the stage shown in FIG. 19 being reached.

The properties of the parts of the oxide film 226 coated with the silicon nitride layer 230 are not materially changed by the treatment in moist nitrogen, so that said parts involve many surface states and few oxide charges.

However, the properties of the oxide film parts 251 and 233 which were subjected indeed to said atmosphere, have changed by the treatment in the moist atmosphere to such an extent that they now involve few surface states. As regards the positive oxide charges the properties of the two oxide film parts have not materially changed so that the part 251 involves few surface states and few oxide charges and the part 233 involves few surface states and many oxide charges. As a result of this, with unbiased gate electrodes, the gate region 228 on the semiconductor surface has an N-conductive channel between the electrodes 224 and 225 due to inversion, while the gate region 227 does not have such an inversion channel.

Two MOS-transistors are obtained in the semiconductor body. The MOS-transistor 72 with the source and drain electrodes 222 and 223, the gate region 227, the gate electrode 264 and the dielectric 251 between the gate electrode 264 and the gate region 227 has a current to gate-voltage characteristic of the type as shown in FIG. 2 by the solid-line curve 21.

The MOS-transistor 271 with the source and drain electrodes 224 and 225, the gate region 228, the gate electrode 265 and the dielectric 233 between the gate electrode 264 and the gate region 228 has a current-to-gate voltage characteristic of the type as shown in FIG. 4 by the solid-line curve 26.

Both an "enhancement-mode" MOS-transistor 270 and a "-depletion-mode" MOS-transistor 271 have been obtained in one silicon body. Since the parts 272, 273, 274 of the oxide film 226 coated with the silicon nitride layer and covering the semiconductor surface of the P-type silicon 221 beyond and between the MOS-transistors 270 and 271 involves few positive oxide charges and many surface states, inversion beside and between the MOS-transistors, for example, produced by an external field, is counteracted so that the formation of annoying strong leakage currents between the N-conductive parts beyond the gate regions, from one MOS-transistor to the other, or to further parts of the integrated circuit, is avoided.

What is claimed is:

1. A semiconductor device comprising a semiconductor body having a surface and adjacent the surface regions of the one and the opposite conductivity type forming a PN-junction extending to the surface, connections to the said regions, an insulating layer on said surface covering the regions and the PN-junction, said insulating layer comprising a first portion and a second portion, said first portion comprising silicon oxide without an overlayer of silicon nitride, said second portion comprising silicon oxide covered with a layer of silicon nitride, one of said first and second portions covering at least partly one of the regions and the PN-junction and establishing at the underlying semiconductor surface relatively few surface states, the other of said first and second portions covering at least part of the other region and being spaced from the PN-junction and establishing at the underlying semiconductor surface relatively many surface states preventing the establishment of an undesired surface channel on the other region.

2. A semiconductor device as set forth in claim 1 wherein said other portion of said insulating layer is the second portion and has the shape of a narrow ring substantially completely surrounding but spaced from the PN-junction.

3. A semiconductor device as set forth in claim 2 wherein the narrow ring has a width less than 100 microns.

4. A semiconductor device as set forth in claim 2 wherein the body is silicon, the other region is P-type, P-type, and the second portion also establishes at the underlying semiconductor surface relatively few positive surface charges.

5. A semiconductor device including a MOS-transistor and comprising a semiconductor body having a surface and adjacent the surface plural regions of the one and the opposite conductivity type forming plural spaced PN-junctions extending to the surface and defining an MOS-channel region therebetween, connections to the said one-type regions to form source and drain electrodes, an insulating layer on said surface covering the regions and the PN-junctions, said insulating layer comprising a first portion and a second portion, said first portion overlying the MOS-channel region and comprising silicon oxide without an overlayer of silicon nitride, said second portion comprising silicon oxide covered with a layer of silicon nitride, said first portion establishing at the underlying semiconductor surface relatively few surface states, a gate electrode on the first insulating layer portion and having a portion overlying the MOS-channel region, said second portion substantially surrounding said one-type regions outside of the gate electrode portion overlying the MOS-channel and establishing at the underlying semiconductor surface relatively many surface states preventing the establishment of an undesired surface channel outside of the MOS-channel region.

6. A semiconductor device as set forth in claim 5 wherein the one type regions are of N-type conductivity and the opposite type region is of P-type conductivity, the first insulating layer portion covers the part of the PN-junctions bordering the MOS-channel, and the second insulating layer portion covers parts of the PN-junctions remote from the MOS-channel.

7. A semiconductor device as set forth in claim 5 wherein the second insulating layer portion establishes at the underlying semiconductor surface relatively few surface charges.

8. A semiconductor device comprising a semiconductor body having a surface and adjacent the surface regions of the one and the opposite conductivity type forming a PN-junction extending to the surface, connections to the said regions for reverse biasing the PN-junction, an insulating layer on said surface covering the regions and the PN junction, said insulating layer comprising a first portion and a second portion, said first portion comprising silicon oxide without an overlayer of silicon nitride, said second portion comprising silicon oxide covered with a layer of silicon nitride, said second portion covering one of the regions and the PN-junction and establishing at the underlying semiconductor surface relatively many surface states and relatively few positive surface charges, said first portion covering at least part of the other region and being spaced from the PN-junction and establishing at the underlying semiconductor surface relatively few surface states and relatively few positive surface charges.

9. A semiconductor device as set forth in claim 8 wherein the body is of silicon.

10. A semiconductor device comprising a semiconductor body having a surface and adjacent the surface plural regions of the one and of the opposite conductivity type forming plural PN-junctions extending to the surface and defining a first enhancement mode MOS-transistor and a second depletion mode MOS-transistor, connections to the said regions, an insulating layer on said surface covering the regions and the PN-junctions, said insulating layer comprising at least first portions and second portions, said first portions comprising silicon oxide without an overlayer of silicon nitride, said second portions comprising silicon oxide covered with a layer of silicon nitride, said first portions covering the channel regions of both MOS-transistors, some of said first portions establishing at the underlying semiconductor surface relatively few surface states and relatively few surface charges, others of said first portions establishing at the underlying semiconductor surface relatively few surface states and relatively many positive surface charges, said second portions surrounding the transistors and being spaced from the channel regions and establishing at the underlying semiconductor surface relatively many surface states preventing the establishment of an undesired surface channel beyond the channel regions.

11. A semiconductor device as set forth in claim 10 wherein the second portions establish at the underlying semiconductor surface relatively few surface charges.

* * * * *